United States Patent [19]
Crockett

[11] Patent Number: 5,489,821
[45] Date of Patent: Feb. 6, 1996

[54] LAMP OSCILLATOR FOR ATOMIC FREQUENCY STANDARDS

[75] Inventor: Jeff D. Crockett, Fullerton, Calif.

[73] Assignee: Ball Corporation, Muncie, Ind.

[21] Appl. No.: 364,765

[22] Filed: Dec. 27, 1994

[51] Int. Cl.$^6$ ................................................ H03L 1/02
[52] U.S. Cl. ........................ 315/151; 315/248; 331/3; 331/109
[58] Field of Search .................. 315/248, 151, 315/224, 348; 323/312; 331/109, 3, 183; 324/304, 305

[56] References Cited

U.S. PATENT DOCUMENTS

| | | | |
|---|---|---|---|
| 2,975,330 | 3/1961 | Bloom et al. | 315/115 |
| 3,109,960 | 11/1963 | Bell et al. | 315/248 |
| 3,129,389 | 4/1964 | Packard et al. | 331/3 |
| 3,192,472 | 6/1965 | Bender et al. | 324/58.5 |
| 3,382,452 | 5/1968 | Rempel et al. | 331/3 |
| 3,390,350 | 6/1968 | Davidovits et al. | 331/94 |
| 3,403,349 | 9/1968 | Wieder | 330/4.3 |
| 3,513,381 | 5/1970 | Happer, Jr. | 324/0.5 |
| 3,584,292 | 6/1971 | Dehmelt | 324/0.5 |
| 3,798,565 | 3/1974 | Jechart | 331/94 |
| 3,815,048 | 6/1974 | Hamlet | 331/109 |
| 3,873,884 | 3/1975 | Gabriel | 315/267 |
| 3,903,481 | 9/1975 | Jechart | 331/3 |
| 4,095,142 | 6/1978 | Murayama et al. | 315/248 |
| 4,314,208 | 2/1982 | Munday | 331/1 A |
| 4,349,798 | 9/1982 | Podell et al. | 333/230 |
| 4,405,905 | 9/1983 | Busca et al. | 331/94.1 |
| 4,434,406 | 2/1984 | Fowks | 331/3 |
| 4,446,446 | 5/1984 | Fowks | 331/3 |
| 4,456,891 | 6/1984 | Fowks | 331/3 |
| 4,462,006 | 7/1984 | Fowks | 331/3 |
| 4,476,445 | 10/1984 | Riley, Jr. | 331/3 |

(List continued on next page.)

FOREIGN PATENT DOCUMENTS

| | | |
|---|---|---|
| 52-19096 | 2/1977 | Japan. |
| 55-107340A | 8/1980 | Japan. |
| 2067751 | 7/1981 | United Kingdom. |

OTHER PUBLICATIONS

Eltsufin, Stern, and Fel, "Compact Rectangular–Cylindrical Cavity for Rubidium Frequency Standard," IEEE Forty–Fifth Annual Symposium on Frequency Control, 1991, pp. 567–571.

Busca et al., "Long–term Frequency Stabilization of the $Rb^{87}$ Maser," 24 IEEE Transactions on Instrumentation and Measurement 291–96 (Dec. 1975).

Matsuda et al. "Signal Intensity Characteristics of the $^{87}$Rb Double Resonance Due to the Pumping Light", Japanese J. of Appl. Physics, vol. 16, No. 3, Mar. 1977, pp. 391–396.

Kuramochi et al., "Composite–type $^{87}$Rb Optical–Pumping Light Source", Optics Letters, vol. 6, No. 2, Feb., 1981, pp. 73–75.

Mathur et al., "Light Shifts in the Alkali Atoms" Physical Review, vol. 171, No. 1, 5 Jul. 1968, pp. 11–19.

Audoin et al., "Atomic Frequency Standards and Clocks", J. of Physics E. Scientific Instruments, vol. 9, No. 9 (1976, Sep.), pp. 697–720.

Primary Examiner—Robert J. Pascal
Assistant Examiner—Michael Shingleton
Attorney, Agent, or Firm—Willian Brinks Hofer Gilson & Lione

[57] ABSTRACT

An apparatus for providing excitation of a vapor discharge lamp includes a control circuit for controlling an oscillator circuit during an ignition mode of the vapor discharge lamp to establish and maintain a substantially constant DC voltage at an output of an oscillator transistor and to establish a current flow through the oscillator transistor at a first current level sufficient to ignite the vapor discharge lamp, and for controlling the oscillator after ignition of the vapor discharge lamp to maintain the substantially constant DC voltage at the output of the oscillator transistor while reducing the current flow through the oscillator transistor from the first current level to a second current level, and in preferred embodiments, includes circuitry to suppress unwanted blocking oscillations and optimize the dynamic range of the control circuitry.

36 Claims, 5 Drawing Sheets

U.S. PATENT DOCUMENTS

| | | | |
|---|---|---|---|
| 4,479,096 | 10/1984 | Fowks | 331/3 |
| 4,485,333 | 11/1984 | Goldberg | 315/149 |
| 4,494,085 | 1/1985 | Goldberg | 331/94.1 |
| 4,495,478 | 1/1985 | Kwon et al. | 333/230 |
| 4,629,887 | 12/1986 | Bernier | 250/251 |
| 4,661,782 | 4/1987 | Weidemann | 331/3 |
| 4,721,890 | 1/1988 | Riley, Jr. | 315/224 |
| 4,899,345 | 2/1990 | Cyr et al. | 372/32 |
| 4,947,137 | 8/1990 | Busca et al. | 331/94.1 |
| 4,968,908 | 11/1990 | Walls | 307/529 |
| 5,101,506 | 3/1992 | Walls | 455/115 |
| 5,172,064 | 12/1992 | Walls | 324/601 |
| 5,327,105 | 7/1994 | Liberman et al. | 331/94.1 |

LAMP OSCILLATOR FOR ATOMIC FREQUENCY STANDARDS

FIELD OF THE INVENTION

The invention relates to means for excitation of a vapor discharge lamp, and more particularly, to an improved r.f. source circuit for igniting and sustaining the discharge in a vapor discharge lamp, such as a rubidium lamp of a rubidium atomic frequency standard.

BACKGROUND OF THE INVENTION

Vapor discharge lamps, such as a rubidium lamp, are used as energy sources having a defined spectral content for optical pumping and atomic absorption in atomic frequency standards. Such vapor discharge lamps are generally excited by an application of radio frequency energy from an electronic power oscillator. Such vapor discharge lamps require an electronic power oscillator, or excitor, that can reliably start the lamp and maintain constant lamp output under varying conditions. Temperature and/or component variations in the oscillator circuit can change the lamp output, both in intensity and spectral distribution. In addition, some variations in the oscillator power supply, such as low frequency ripple, can impress disturbances on the light output. Likewise, variations in the load presented to the oscillator by the vapor discharge lamp can induce variations in the excitation power and thereby cause periodic fluctuations in the lamp output. Variations in lamp output due to temperature changes, component variations, and variations of the excitation power are typical of the difficulties often encountered in starting and sustaining an electrodeless vapor discharge lamp using conventional excitation circuitry.

Typically, a vapor discharge lamp, such as a rubidium lamp, is ignited by an r.f. excitation field generated by a coil driven by an r.f. oscillator. Unfortunately, the impedance of the lamp traverses extremes, equivalent to a pure capacitance prior to ignition and, after ignition, becoming a complex impedance changing with the level of the r.f. ignition signal and the lamp temperature.

In addition, lamp oscillator circuits continue to be plagued by a phenomenon known as "blocking oscillations", in which the lamp oscillator generates a low frequency amplitude modulation of the r.f. excitation output of the lamp oscillator at frequencies such as for example, around about 150 kHz. Since the light output of the lamp oscillator is a function of the r.f. power to the bulb, such blocking oscillations will modulate the light intensity out of the lamp system at the blocking oscillation frequency. The phenomenon of blocking oscillations is not fully understood and there presently is no analytical prediction of the frequency or percent modulation of the blocking oscillations. The blocking oscillations, however, tend to appear at lower oscillator transistor current levels in field effect oscillator transistor (FET) oscillators than in bi-polar transistor oscillators.

In an FET oscillator circuit, for example, a portion of the output r.f. excitation signal is fed back to the input of the oscillator FET to provide the desired regenerative feedback for purposes of sustaining the r.f. output. The current through the transistor is proportional to the square of the feedback voltage, with a drain to source voltage (VDS) being greater than the threshold voltage (VTH) of the FET and for voltages from gate to source (VGS) greater than VTH. Accordingly, with a symmetrical r.f. feedback signal about the DC bias level on the gate of the FET, the positive excursions of the r.f. feedback signal increase the transistor current more than the negative excursions decrease the transistor current. As a result, an increase in the r.f. amplitude of the feedback signal will increase the DC current through the FET, which then increases the oscillator loop gain, which in turn encourages the increased r.f. amplitude, thereby establishing an undesirable regenerative feedback loop resulting in the blocking oscillations. Other factors which may contribute to the blocking oscillations include the RC time constant of the r.f. feedback path and the oscillator's output r.f. amplitude response time to DC current changes.

Although the blocking oscillation generation has been described above with respect to the operation of an FET transistor implementation, the same problem exists in a bi-polar transistor implementations as a result of the logarithmic Vbe to Ic relationship. In all lamp oscillator circuits, however, it is desirable to not have the blocking oscillations occur at transistor currents near the intended operating range.

A number of attempts have been made to stabilize the output the r.f. oscillator used to drive the vapor discharge lamp. For example, U.S. Pat. No. 4,456,891 to Fowks discloses an r.f. oscillator circuit for igniting a rubidium lamp in a rubidium frequency standard which is adjustable in power and regulated with a fixed DC voltage and which utilizes current sensed feedback to permit r.f. oscillator power variations to compensate for variations in impedance. Furthermore, when the rubidium standard is initially turned on, the lamp heater is monitored and the lamp r.f. power is forced to maximum until the proper heater temperature is reached to reduce rubidium lamp warm-up time and assure proper lamp ignition. After the appropriate heater temperature is reached, the lamp r.f. power is automatically reduced to a preset value which may be determined by a manual setting of a potentiometer in the current sensed feedback circuit of the oscillator. In addition, a light sensing feedback circuit employing the photodiode of the rubidium frequency-generating cell is utilized to apply a delayed level sensitive control to the r.f. oscillator to maintain proper lamp ignition.

U.S. Pat. No. 4,721,890 discloses a system in which the output of an alkaloid vapor lamp for use in an optical pumping system is stabilized by use of a feedback circuit which regulates current flow of an electronic power oscillator used to excite the alkaloid vapor lamp. Starting of the alkaloid vapor lamp is facilitated by increasing the supply current to the oscillator until the alkaloid vapor lamp is lit.

In spite of the prior efforts to stabilize the operation of the oscillator circuitry for use for the ignition and sustaining operation of a vapor discharge lamp, improvements in the means for exciting the vapor discharge lamps of atomic frequency standards are needed, including improvements in lamp oscillator circuits.

SUMMARY OF THE INVENTION

The invention relates to an apparatus for providing excitation of a vapor discharge lamp, such as, for example, a rubidium lamp of the type used in atomic frequency standards.

Apparatus of the invention provides increased oscillator current in a method which maintains a constant voltage across a current sensing resistor network which is used to set the oscillator current. Since the DC power supply is across the series combination of the oscillator transistor and the current sensing network, and since the DC power supply is regulated, the DC voltage across the oscillator transistor is also relatively constant. The constant voltage across the oscillator transistor prevents the increased current required for ignition from decreasing the available voltage swing, thereby providing more reliable starting of the vapor discharge lamp of an atomic frequency standard.

Such an apparatus includes a substantially constant voltage DC power source with a coupled oscillator circuit. The oscillator circuit includes a first transistor, or oscillator transistor, configured with regenerative feedback. The oscillator transistor provides an excitation output coupled to the vapor discharge lamp. The apparatus further includes a control device for controlling the oscillator circuit during an ignition stage of the vapor discharge lamp to establish and maintain a substantially constant DC voltage at the output of the oscillator transistor and to establish a current flow through the oscillator transistor at a first current level sufficient to ignite the vapor discharge lamp, and for controlling the oscillator after ignition of the vapor discharge lamp to maintain the substantially constant DC voltage at the output of the oscillator transistor while reducing the current flow through the oscillator transistor from the first current level to a second current level. After the ignition of the vapor discharge lamp, the control device maintains a constant reduced input current to the oscillator circuit, and with a regulated constant applied voltage and a constant voltage across the current sensing network, the oscillator voltage is substantially constant, and with a constant oscillator efficiency, the r.f. power output is maintained substantially constant. The input DC current controlled combined with the input DC supply voltage being regulated results in the input power being constant. Thus, with a constant oscillator efficiency the r.f. output power is constant.

Preferably, the oscillator transistor is a field effect transistor. The oscillator transistor, however, may also be a bipolar transistor. In the prior art the oscillator active device was an r.f. bipolar power device. The oscillator output amplitude was large, e.g. 15 to 25 Vpp, which made it difficult to protect the base-emitter junction from reverse breakdown since it needed to be in the regenerative feedback path. The typical maximum allowed reverse base-emitter voltage is approximately 5 V. Exceeding this limit manifested itself as continual degradation of transistor beta. Protecting the transistor required elaborate clamping schemes which were difficult to implement without seriously degrading the oscillator's output r.f. power. The employment of a field effect transistor avoids these problems and is thus preferred.

In preferred embodiments of the invention, the control device includes a photodetector circuit having a photodetector positioned to receive light from the vapor discharge lamp, and having an output for supplying a signal corresponding to an amount of detected light. The control device further includes a light comparator, such as an op-amp configured as a comparator, having a first input coupled to a reference voltage, a second input coupled to the output of the photodetector, and an output. A switching transistor, such as a bipolar transistor, is coupled to the output of the light comparator, and resistance is coupled to an output of the switching transistor. This resistance that is switched in to the current sensing resistor network, for the first current level, is effectively coupled in parallel with the resistance which is there for both the first and second current levels. Since the voltage across the current sensing resistor network is constant, the oscillator current is thus inversely proportional to the total effective resistance. The resistance which is switched in for the first current level lowers the net effective resistance, and thus, adds the change in current from the second level to the first current level.

Prior to ignition of the vapor discharge lamp the photodetector circuit detects an absence of light from the vapor discharge lamp and generates a first signal which is supplied to the second input of the light comparator. The light comparator responds by generating an error signal for turning ON the switching transistor to thereby establish a current flow at the first current level through the oscillator transistor and the output resistance of the switching transistor. After the ignition of the vapor discharge lamp, the photodetector circuit detects the presence of light and generates a second signal which is supplied to the light comparator. The light comparator responds by turning OFF the switching transistor to reduce the current flow through the oscillator transistor from the first current level to the second current level.

In some embodiments of the invention, the control device further includes a control op-amp having a first input coupled to a reference voltage, a second input coupled to the output of the oscillator transistor, and an output coupled to an input of the oscillator transistor; and a shift circuit having an input coupled to the output of the oscillator transistor and having an output coupled to the output of the control op-amp. The shift circuit senses the r.f. component of the oscillator output and provides a r.f. proportional signal to shift the effective operating range of the control op-amp. The shift circuit samples the r.f. signal present at the output of the oscillator transistor and rectifies the r.f. signal to generate a DC shift signal corresponding to the r.f. signal but having a polarity opposite to the polarity of the output of the control op-amp to force the control op-amp to generate an output voltage to nullify a voltage of the DC shift signal. The shift circuit is effective in suppressing blocking oscillations, thereby allowing the oscillator transistor to operate at lower current levels without generating blocking oscillations than would be possible without the shift circuit. In addition the shift circuit suppresses blocking oscillations at frequencies greater than the bandwidth of the control device.

Preferably, the shift circuit includes a high frequency switching diode, such as a Schottky diode, having a cathode coupled to the output of the oscillator transistor; a capacitor having a first terminal connected to an anode of the high frequency switching diode and a second terminal coupled to a circuit ground; and a first resistor having a first terminal coupled to the anode of the high frequency switching diode and a second terminal coupled to the output of said control op-amp.

The shift circuit may further include an R-C circuit coupled in parallel with the first resistor. Thus, the shift circuit includes circuitry which allows for setting a DC feedback gain of the shift circuit, and for setting an AC feedback gain of the shift circuit, wherein an adjustment of the AC feedback gain does not affect an amount of the DC feedback gain.

Other features and advantages of the invention may be determined from the drawings and detailed description of the invention that follow.

DETAILED DESCRIPTION OF PREFERRED EMBODIMENTS

Figure 1:
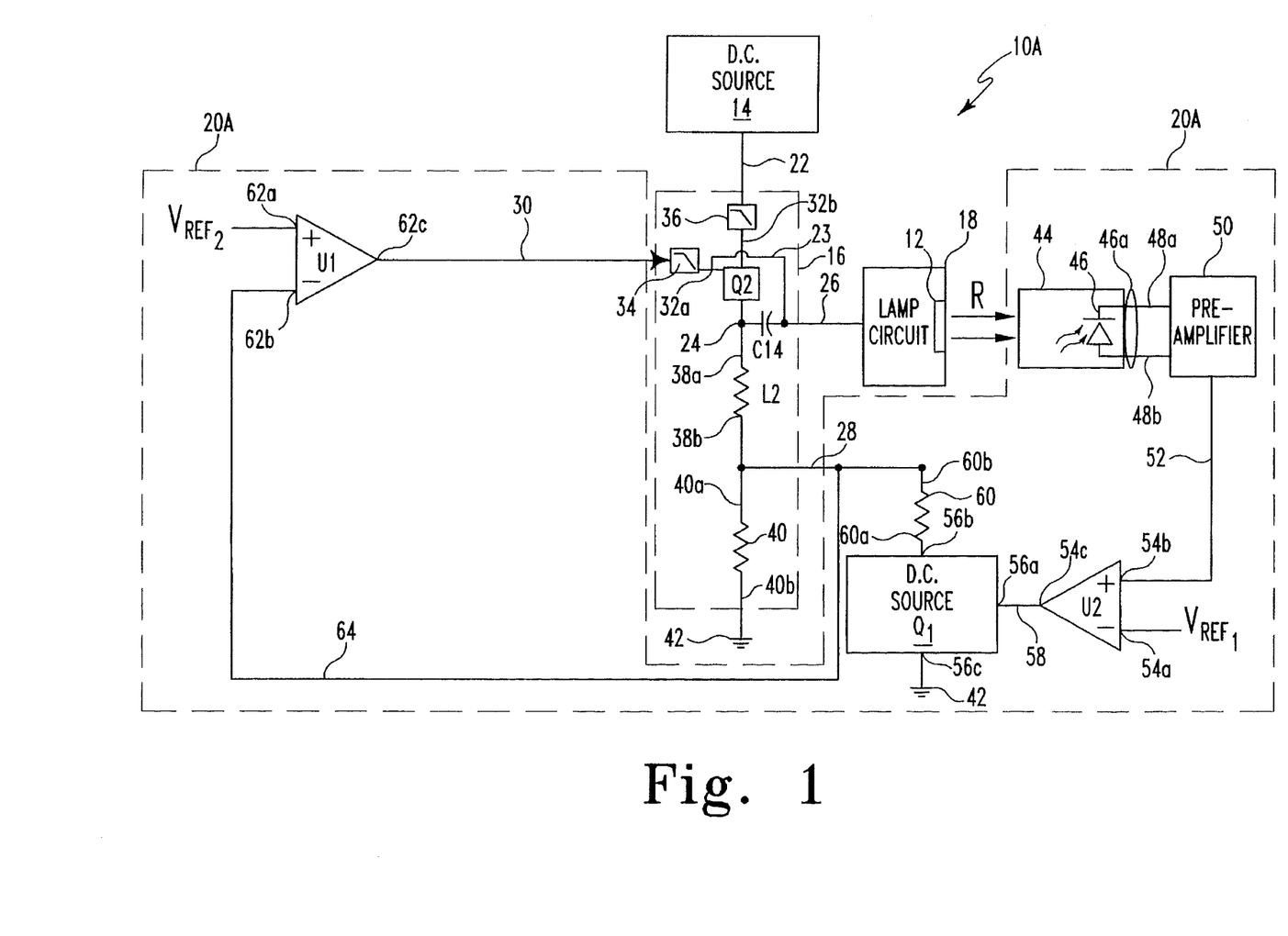
FIG. 1 shows a block diagram of the lamp oscillator of the invention.
Figure 2:
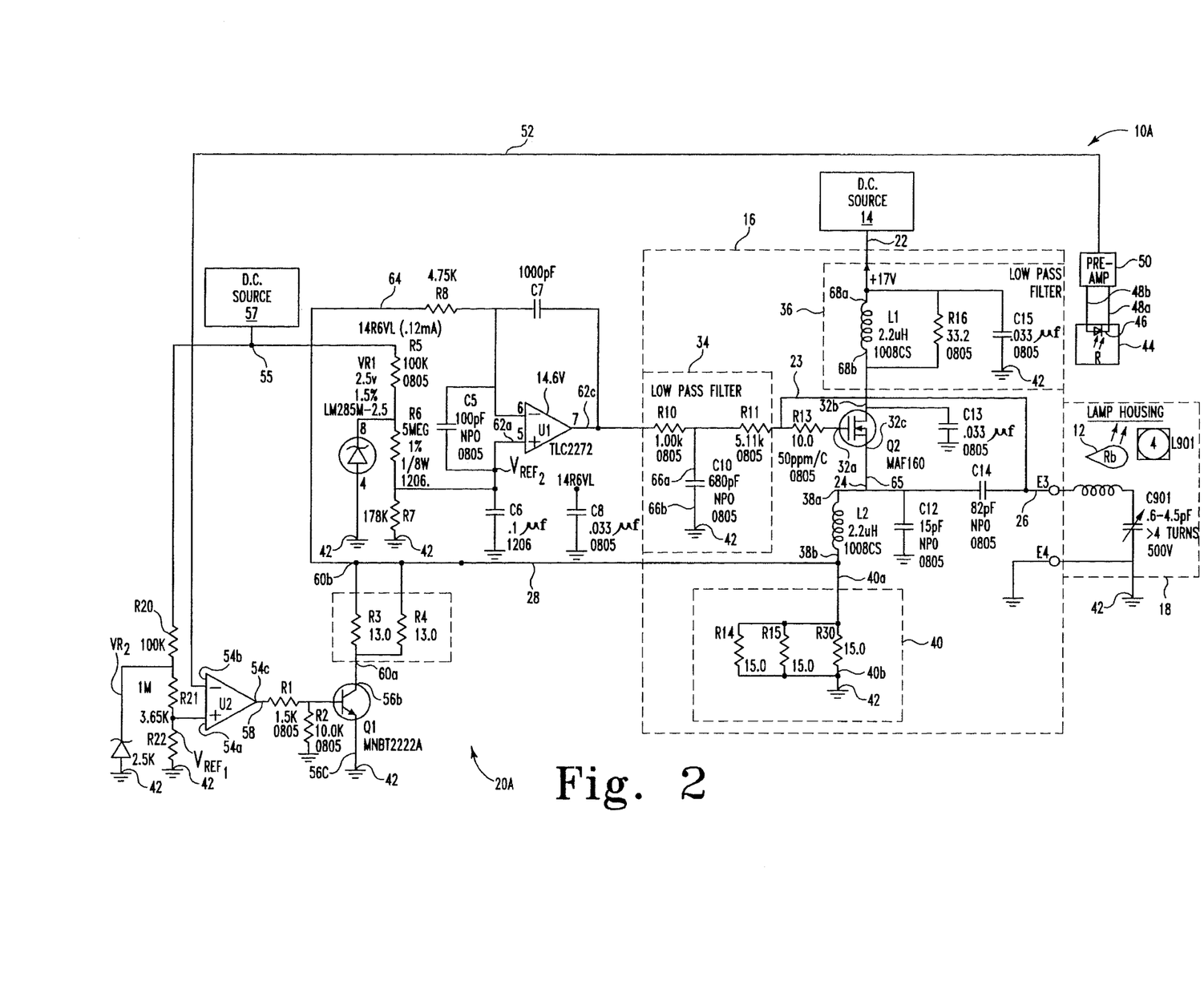
FIG. 2 shows a schematic diagram of a preferred circuit configuration corresponding to the lamp oscillator of FIG. 1.
Figure 3:
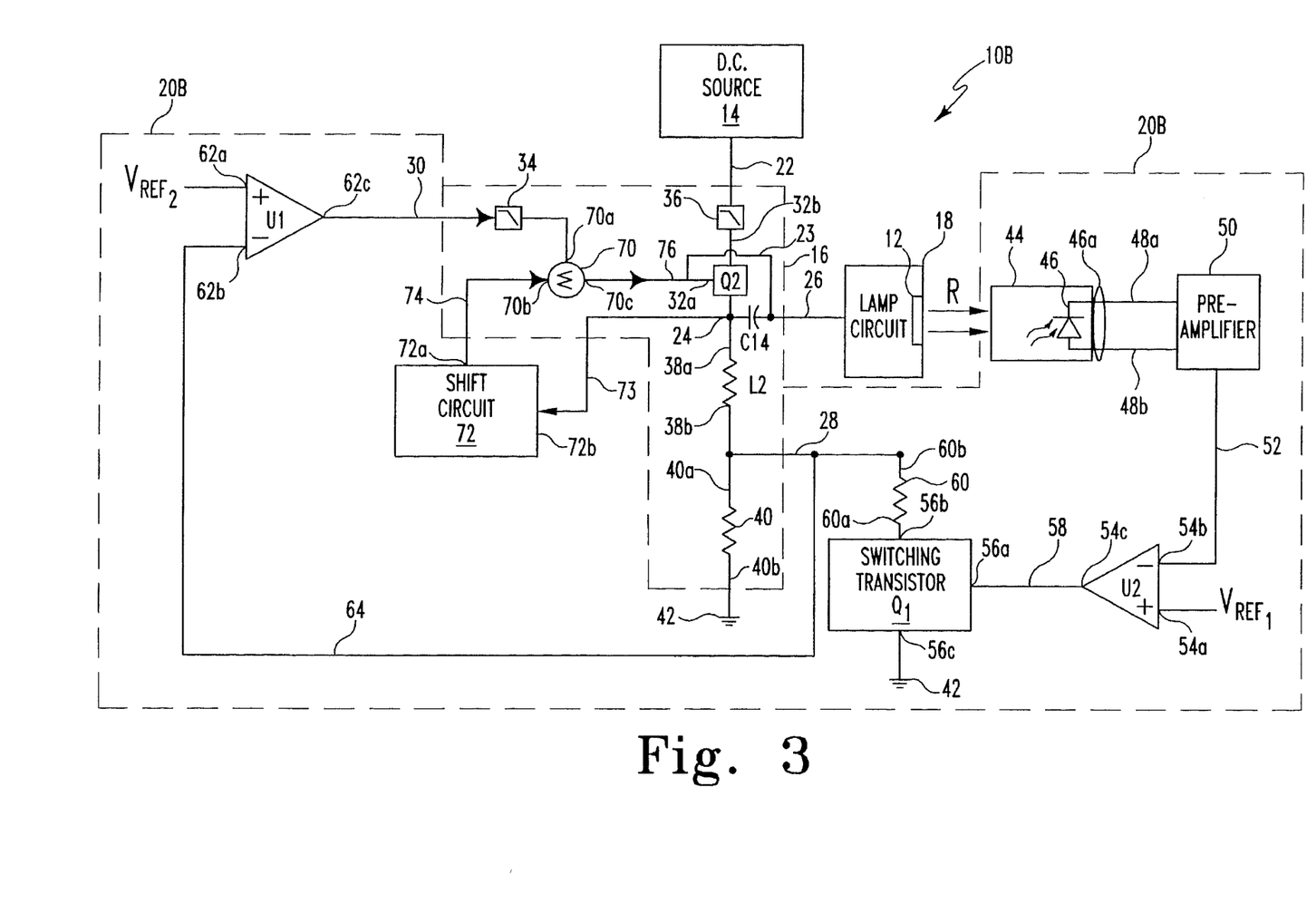
FIG. 3 is an alternative embodiment of the lamp oscillator of FIG.
Figure 4:
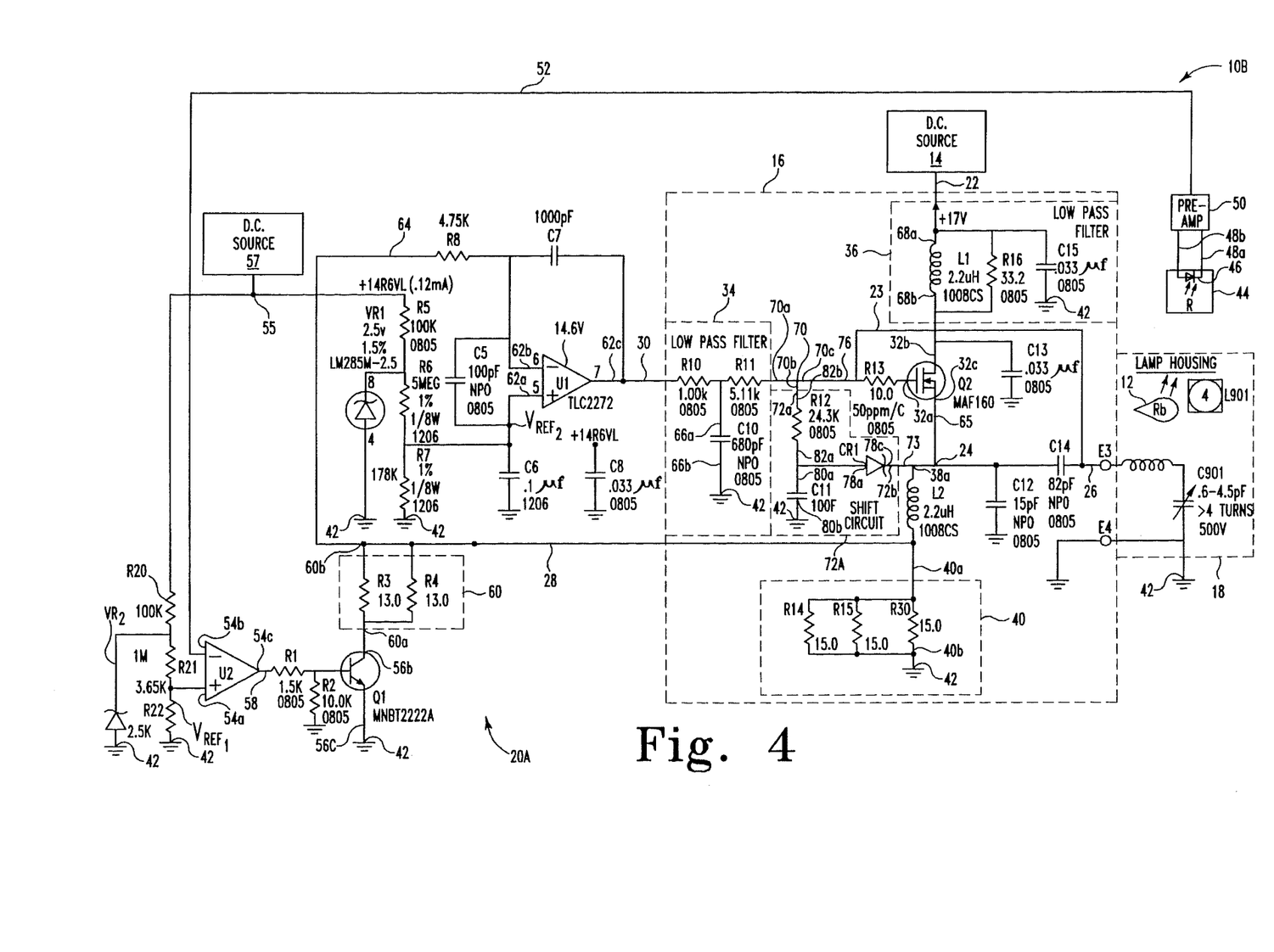
FIG. 4 shows a schematic diagram of a preferred circuit configuration corresponding to the lamp oscillator shown in FIG. 3.

FIGS. 1–4 illustrate alternate embodiments of the invention, FIGS. 1 and 2 illustrating one embodiment and FIGS. 3 and 4 illustrating an alternate and more preferred embodiment. Corresponding elements of the two embodiments are labeled with the same element numbers, the suffixes A,a and B,b being used, respectively, with the embodiment of FIGS. 1 and 2 and the embodiment of FIGS. 3 and 4, as explained below. In general, in descriptions of common elements of the invention, the suffixes A and B are sometimes omitted.

Generally, lamp oscillator 10 generates a variable excitation current used to generate a variable excitation field for igniting a vapor discharge lamp 12 during an ignition mode and for sustaining the operation of vapor discharge lamp 12 during a run mode. Vapor discharge lamp 12 can be, for example, a rubidium vapor lamp of the type used in rubidium atomic frequency standards.

During the run mode, lamp oscillator 10 reduces the excitation current from the current level used for ignition of vapor discharge lamp 12, without reducing the DC voltage across the oscillator transistor Q2, thereby without reducing the output voltage swing capability of the lamp oscillator 10 for either the ignition mode or the run mode. In preferred embodiments, additional circuitry is provided to enhance the operation of the circuit components used to maintain the substantially constant voltage swing capability for the lamp excitation voltage.

Lamp oscillator 10 includes a regulated, substantially constant voltage DC source 14, an oscillator circuit 16, a lamp circuit 18 and a control circuit 20. DC source 14 supplies DC voltage and current via conductor 22 to oscillator circuit 16. Oscillator circuit 16 includes an oscillator transistor Q2, such as a bipolar or field effect transistor, and includes filtering and/or current limiting components. Oscillator transistor Q2 is configured with regenerative feedback 23 to generate an r.f. excitation signal which is present at an excitation output 24. Excitation output 24 is coupled from oscillator circuit 16 to a vapor discharge lamp 12 via conductor 26 and a tuning circuit (not shown) in lamp circuit 18. The excitation signal supplied to vapor discharge lamp 12 ignites and sustains the ignition of vapor discharge lamp 12 to generate electromagnetic radiation R in the form of light.

Control circuit 20 includes circuitry for detecting the intensity of radiation R generated by vapor discharge lamp 12 and for generating therefrom a control signal which is used internally to establish at least two distinct levels of current flow through oscillator transistor Q2. To insure proper ignition of vapor discharge lamp 12 at start-up, while providing for conservation of electrical power during sustained operation, control circuit 20 includes circuitry coupled to oscillator 16 via conductor 28 to establish a current flow through transistor Q2 which is higher during the ignition of vapor discharge lamp 12 (ignition mode) than after ignition of vapor discharge lamp 12 (run mode).

Control circuit 20 further includes circuitry coupled to oscillator 16 via conductor 30 for maintaining a substantially constant DC voltage at excitation output 24 during both the ignition mode and the run mode. By maintaining the substantially constant DC voltage at excitation output 24, the voltage swing capability associated with transistor Q2 is substantially constant, i.e. the r.f. excitation voltage swing is not reduced by the increased current through transistor Q2 during the ignition mode.

Thus, during the ignition mode, control circuit 20 controls the operation of oscillator 16 to establish and maintain a substantially constant DC voltage at output 24 of oscillator transistor Q2 and to establish a current flow through oscillator transistor Q2 at an elevated current level sufficient to ignite vapor discharge lamp 12. After ignition of vapor discharge lamp 12, however, control circuit 20 controls oscillator 16 to maintain the substantially constant DC voltage at excitation output 24 of transistor Q2, while reducing the current flow through transistor Q2 from the elevated current level to a lower current level, the voltage swing capability remaining constant. Accordingly, after ignition of vapor discharge lamp 12, control circuit 20 maintains a constant input power to oscillator circuit 16. In addition, since a substantially constant DC voltage is always present at excitation output 24, control circuit 20 effectively compensates for temperature and aging affects on the operating characteristics of oscillator circuit 16.

FIGS. 1 and 3 show detailed block diagrams depicting alternative embodiments of lamp oscillator 10. Accordingly, the lamp oscillators of FIGS. 1 and 3 will be referred to as lamp oscillator 10A and lamp oscillator 10B, respectively. Where possible, circuit components which are common to each embodiment will be identified by the same element numbers. The distinction between the embodiments shown in FIGS. 1 and 3 lies in the control circuitry used to control oscillator circuit 16, and is discussed below. Accordingly, the control circuitry of FIGS. 1 and 3 will be identified as control circuit 20A and control circuit 20B, respectively.

As shown in FIG. 1, lamp oscillator 10A includes an oscillator 16, a lamp circuit 18, and a control circuit 20A.

Oscillator circuit 16 includes oscillator transistor Q2 having a control input 32a, a power supply current input 32b, and an excitation output 24. Control input 32a is coupled to control circuit 20A via a low pass filter 34 and conductor 30. Current input 32b of oscillator transistor Q2 is coupled to DC source 14 via a low pass filter 36 and conductor 22. Excitation output 24 of oscillator transistor Q2 is coupled to a first terminal 38a of an inductor L2. A second terminal 38b of inductor L2 is connected in series with a first terminal 40a of resistor 40. A second terminal 40b of resistor 40 is coupled to ground 42. Since resistor 40 is coupled between the excitation output 24 of oscillator transistor Q2 and ground 42, resistor 40 limits the current flow through oscillator transistor Q2 during both the ignition mode and the run mode.

Transistor Q2 is configured with regenerative feedback, which includes a capacitor C14 coupled between regenerative feedback line 23 and excitation output 24. Thus, a portion of the output signal is fed back to control input 32a of oscillator transistor Q2 to cause oscillator transistor Q2 to function as an oscillator.

Control circuit 20A includes a photodetector circuit 44 having a photodetector diode 46 positioned to receive light R from vapor discharge lamp 12. Photodetector diode 46 generates a signal corresponding to the intensity of the received light radiation R and provides an output 46a for supplying the light intensity signal via conductors 48a and 48b to a pre-amplifier 50. Pre-amplifier 50 amplifies the light intensity signal to generate a light signal which in turn is supplied via conductor 52 to a light comparator U2. Light comparator U2 includes a non-inverting input 54a coupled to a reference voltage $V_{REF1}$, such as, for example 1 volt, and an inverting input 54b coupled to output 46a of photodetector diode 46 via conductor 52, pre-amplifier 50 and conductors 48a and 48b. Light comparator U2 further includes an output 54c.

Control circuit 20A further includes a switching transistor Q1 having a control input 56a serving as a control port, a current input 56b serving as a controlled port, and an output 56c coupled to ground 42. Although switching transistor Q1 can be either a bipolar transistor or FET, the preferred transistor for switching transistor Q1 is a bipolar transistor. Control input 56a of switching transistor Q1 is coupled to output 54c of light comparator U2 via conductor 58. Thus, an output signal generated by comparator U2 controls the operation of transistor Q1. Current input 56b of switching transistor Q1 is coupled to a resistor 60 at a first terminal 60a thereof. A second terminal 60b of resistor 60 is coupled to excitation output 24 of oscillator transistor Q2 via conductor 28 and inductor L2. Second terminal 60b of resistor 60 is also coupled to first terminal 40a of resistor 40 of oscillator circuit 16.

By selectively turning switching transistor Q1 ON or OFF, the current flow through oscillator transistor Q2 can be switched between two distinct current levels. For example, when switching transistor Q1 is turned ON, then resistors 40 and 60 form a parallel combination which reduces the resistance present between excitation output 24 of oscillator transistor Q2 and ground 42. When switching transistor Q1 is turned OFF, however, then switching transistor Q1 effectively forms between terminals 56b and 56c thereof an open circuit having an extremely high resistance (theoretically infinite). This "infinite" resistance formed by switching transistor Q1 is in series with resistor 60. Thus, when switching transistor Q1 is turned OFF, the effective resistance between excitation output 24 of transistor Q2 and ground 42 is the resistance of resistor 40.

Prior to ignition of vapor discharge lamp 12 (ignition mode), photodetector diode 46 of photodetector circuit 44 detects an absence of light from vapor discharge lamp 12 and generates a first signal (zero volts) which is supplied via pre-amplifier 50 to inverting input 54b of light comparator U2. This first signal is compared to $V_{REF1}$ (e.g., one volt) present at the non-inverting input 54a of light comparator U2. Light comparator U2 responds by generating a positive error signal for turning ON switching transistor Q1 to thereby establish an effective resistance from excitation output 24 to ground 42 which is equal to the parallel combination of resistors 40 and 60. This results in an effective reduction in the resistance between excitation output 24 of transistor Q2 and ground 42. Accordingly, during the ignition mode, when transistor Q2 is gated at its control input 32a, transistor Q2 responds by conducting a current flow between current input 32b and excitation output 24 which is at an elevated current level as compared to the amount of current which would have flowed through oscillator transistor Q2 had the reduction of resistance not been made.

After the ignition of vapor discharge lamp 12 (run mode), photodetector diode 46 of photodetector circuit 44 detects a presence of light generated by vapor discharge lamp 12 and generates a second signal at a positive voltage level which is amplified by pre-amplifier 50 and supplied to inverting input 54b of light comparator U2. When the voltage level of the second signal present at inverting input 54b of light comparator U2 exceeds the voltage of voltage reference $V_{REF1}$ (e.g. one volt) present at non-inverting input 54a of light comparator U2, light comparator U2 responds by generating a zero error signal to turn OFF switching transistor Q1 to thereby effectively raise the resistance between excitation output 24 to the resistance of resistor 40 by establishing a substantially infinite resistance in parallel with resistor 40, thereby establishing an effective total resistance between excitation output 24 and ground 42 which is substantially equal to the resistance of resistor 40 alone, which is a higher resistance than the parallel combination of resistors 40 and 60. Accordingly, during the run mode, when oscillator transistor Q2 is gated at its control input 32a, oscillator transistor Q2 responds by conducting a current flow between current input 32b and excitation output 24 which is at a reduced current level from the current level associated with the ignition mode.

Although the current flow through oscillator transistor Q2 is dependent upon the effective resistance between excitation output 24 of oscillator transistor Q2 and ground 42, such is not the case with regard to DC voltage present at excitation output 24. The current levels established through oscillator transistor Q2 are dependent upon the total effective resistance between excitation output 24 and ground 42 resulting from the parallel combination of resistor 40 and the resistor 60 in series with the controlled current path between terminals 56b and 56c of switching transistor Q1. The DC voltage at the excitation output 24 of oscillator transistor, however, is conveniently controlled to remain substantially constant regardless of whether lamp oscillator 10A is operating in the ignition mode or the run mode, provided the DC resistance of inductor L2 is low.

As shown in FIG. 1, control circuit 20A maintains a substantially constant DC voltage at terminal 40a of resistor 40 in oscillator 16. Since the resistance of inductor L2 is low, the DC voltage at excitation output 24 during both the ignition mode and the run mode is also substantially constant. By maintaining the substantially constant DC voltage at excitation output 24, the voltage swing capability associated with transistor Q2 is constant, i.e. the r.f. excitation swing is not reduced by the increased current through transistor Q2 during the ignition mode.

As shown in FIG. 1, control circuit 20A includes a control op-amp U1 which generates an error signal based upon a voltage difference between the DC voltage across R40 (i.e. the DC voltage at excitation output 24 of oscillator transistor Q2) and a reference voltage $V_{REF1}$ (e.g., 0.38 volts), which is used to control oscillator transistor Q2 to maintain a substantially constant DC voltage at excitation output 24 during both the ignition mode and the run mode. The current flowing through oscillator transistor Q2 is controlled by control op-amp U1 so that the DC voltage from the excitation output 24 to ground 42 is substantially equal to the voltage of voltage reference $V_{REF2}$. For example, if the voltage of $V_{REF2}$ is equal to 0.38 volts, then the DC voltage from excitation output 24 to ground 42 will be controlled to be substantially equal to 0.38 volts, regardless of whether the current through oscillator transistor is at the higher level as it is during the ignition mode by turning switching transistor Q1 ON, or whether the current through oscillator transistor Q2 is reduced to the lower level as it is during the run mode by turning switching transistor Q1 OFF.

Control op-amp U1 includes a non-inverting input 62a, an inverting input 62b and an output 62c. Non-inverting input 62a is coupled to reference voltage $V_{REF2}$ (preferably about 0.38 volts). Inverting input 62b of control op-amp U1 is coupled to excitation output 24 of oscillator transistor Q2 via conductor 64, conductor 28, and inductor L2. Output 62c of control op-amp U1 is coupled to control input 32a of oscillator transistor Q2 via conductor 30 and low pass filter 34. The current flowing through oscillator transistor Q2 generates a voltage drop across resistor 40, which in turn is applied to the inverting input 62b of control op-amp U1. Control op-amp U1 then compares the voltage drop across R40 with the voltage of voltage reference $V_{RFE2}$ which is present at the non-inverting input 62a of control op-amp U1. Since the DC gain of op-amp U1 is very large, e.g. 20,000 to 100,000, a minute difference between the voltage levels at the non-inverting and inverting inputs 62a and 62b, respectively, of op-amp U1 will result in a significant change of voltage level at the output of control op-amp U1.

If the voltage at inverting input 62b exceeds the voltage at non-inverting input 62a, yielding a positive error, then control op-amp U1 responds by reducing the magnitude of the voltage at output 62c which is applied to the control input 32a of oscillator transistor Q2. Oscillator transistor Q2 responds by reducing the current flow therethrough, thereby reducing the voltage drop across resistor 40, which in turn reduces the voltage at the inverting input 62b of control op-amp U1, thereby reducing the positive error.

If the voltage at inverting input 62b is less than the voltage at non-inverting input 62a, yielding a negative error, then control op-amp U1 responds by increasing the magnitude of the voltage at output 62c which is applied to the control input 32a of oscillator transistor Q2. Oscillator transistor Q2 responds by increasing the current flow therethrough, thereby increasing the voltage drop across resistor 40, which in turn increases the voltage at the inverting input 62b of control op-amp U1, thereby reducing the negative error.

Thus, the DC voltage from excitation output 24 to ground 42 will be controlled to be substantially equal to the voltage of $V_{REF2}$, provided that the resistance of inductor L2 is small. Such control takes place regardless of whether the current through oscillator transistor is at the higher level as it is during the ignition mode by turning switching transistor Q1 ON, or whether the current through oscillator transistor Q2 is reduced to the lower level as it is during the run mode by turning switching transistor Q1 OFF. Accordingly, lamp oscillator 10A advantageously maintains a substantially constant voltage swing capability for the r.f. excitation voltage at excitation output 24 of oscillator transistor Q2 during both the ignition mode and the run mode.

FIG. 2 shows a schematic diagram of a preferred circuit configuration corresponding to lamp oscillator 10A described in relation to FIG. 1. As shown in FIG. 2, lamp oscillator 10A includes an oscillator 16, a lamp circuit 18, and a control circuit 20A.

Oscillator circuit 16 includes oscillator transistor Q2, preferably a field effect transistor (FET), having a gate 32a, a drain 32b, and a source 32c. Source 32c of oscillator FET Q2 corresponds to excitation output 24, separated only by a substantially zero impedance conductor 65. Gate 32a is coupled to control circuit 20A via a resistor R13, low pass filter 34 and conductor 30. Low pass filter 34 includes an input resistor R10 coupled to an output resistor R11. A capacitor C10 is connected at a first terminal 66a between resistors R10 and R11, and is connected at a second terminal 66b to ground 42.

Drain 32b of oscillator FET Q2 is coupled to DC source 14 via low pass filter 36 and conductor 22. Low pass filter 36 includes an inductor L1 having an input terminal 68a coupled to DC source 14 and having an output 68b coupled to drain 32b of oscillator FET Q2. Low pass filter 36 further includes a resistor R16 connected in parallel with inductor L1, and a capacitor C15 connected between input 68a of inductor L1 and ground 42.

Source 32c of oscillator FET Q2, corresponding to excitation output 24, is coupled to first terminal 38a of inductor L2. Second terminal 38b of inductor L2 is connected in series with first terminal 40a of resistor 40. Resistor 40 includes a parallel combination formed by resistors R14, R15, and R30. Second terminal 40b of resistor 40 is coupled to ground 42. Since resistors R14, R15, R30 are coupled between the excitation output 24 of oscillator FET Q2 and ground 42, resistors R14, R15, R30 limit the current flow through oscillator FET Q2 during both the ignition mode and the run mode.

Oscillator FET Q2 is configured with regenerative feedback, which includes capacitor C14 coupled between regenerative feedback line 23 and excitation output 24. Thus, a portion of the output signal is fed back to gate 32a of oscillator FET Q2 to cause oscillator FET Q2 to function as an oscillator.

Control circuit 20A includes a photodetector circuit 44 having a photodetector diode 46 positioned to receive light R from vapor discharge lamp 12. Photodetector diode 46 generates a converted current signal corresponding to the intensity of the received light radiation R and provides an output 46a for supplying the converted current light intensity signal via conductors 48a and 48b to a pre-amplifier 50. Pre-amplifier 50 converts the light intensity current signal to generate a light intensity voltage signal which in turn is supplied via conductor 52 to a comparator U2. Comparator U2 includes a non-inverting input 54a coupled to a reference voltage $V_{REF1}$, such as, for example 1 volt, and an inverting input 54b coupled to output 46a of photodetector diode 46 via conductor 52, pre-amplifier 50 and conductors 48a and 48b. Comparator U2 further includes an output 54c.

Voltage reference $V_{REF1}$ is generated by a circuit including three resistors, R20, R21, and R22, connected in series between an output 55 of DC voltage source 57 and ground 42. DC voltage source 57 has an output voltage, for example, of 14.6 volts. A 2.5 volt zener-like diode VR2, such as for example, a band-gap zener diode which has low noise generation and good stability with variations in temperature, is connected in parallel with the series resistors R21, R22 so as to establish a controlled voltage drop of 2.5 volts across resistors R21, R22. The values of resistors R21, R22 are selected so as to establish the desired voltage drop across resistor R22, which in turn establishes the voltage of voltage reference $V_{REF1}$.

Control circuit 20A further includes a switching transistor Q1, such as a bipolar transistor, having a base 56a serving as a control port, a collector 56b serving as a controlled port, and an emitter 56c coupled to ground 42. Base 56a of switching transistor Q1 is coupled to output 54c of comparator U2 via conductor 58 and a voltage divider circuit formed by resistors R1 and R2. Thus, an output signal generated by comparator U2, as attenuated by voltage divider R1, R2, controls the operation of transistor Q1. Collector 56b of switching transistor Q1 is coupled to a resistor 60 at a first terminal 60a thereof. Resistor 60 is formed by a parallel combination of resistors R3 and R4. A second terminal 60b of resistor 60 (resistors R3, R4) is coupled to excitation output 24 of oscillator FET Q2 via conductor 28 and inductor L2. Second terminal 60b of resistors R3, R4 is also coupled to first terminal 40a of resistors R14, R15, R30 of oscillator circuit 16.

By selectively turning switching transistor Q1 ON or OFF, the current flow through oscillator FET Q2 can be switched between two distinct current levels. For example, when switching transistor Q1 is turned ON, then resistors R3, R4, R14, R15, and R30 form a parallel combination which reduces the resistance present between excitation output 24 of oscillator FET Q2 and ground 42. When switching transistor Q1 is turned OFF, however, then switching transistor Q1 forms between terminals 56b and 56c thereof an open circuit having an extremely high resistance (theoretically infinite). This "infinite" resistance formed by switching transistor Q1 is in series with the parallel resistors R3, R4 forming resistor 60. Thus, when switching transistor Q1 is turned OFF, the effective resistance between excitation output 24 of transistor Q2 and ground 42 is resistance of parallel resistors R14, R15, R30 in oscillator circuit 16.

Prior to ignition of vapor discharge lamp 12 (ignition mode), photodetector diode 46 of photodetector circuit 44 detects an absence of light from vapor discharge lamp 12 and generates a first signal (zero volts) which is supplied via pre-amplifier 50 to inverting input 54b of comparator U2. This first signal is compared to $V_{REF1}$, (e.g., one volt) present at the non-inverting input 54a of comparator U2. Comparator U2 responds by generating a positive error signal for turning ON switching transistor Q1 to thereby establish an effective resistance from excitation output 24 to ground 42 which is equal to the parallel combination of resistors R3, R4, R14, R15 and R30. This results in an effective reduction in the resistance between excitation output 24 of oscillator FET Q2 and ground 42. Accordingly, during the ignition mode, when transistor Q2 is gated at its gate 32a, oscillator FET Q2 responds by conducting a current flow between drain 32b and excitation output 24 which is at an elevated current level as compared to the current level associated with the run mode.

After the ignition of vapor discharge lamp 12 (run mode), photodetector diode 46 of photodetector circuit 44 detects a presence of light generated by vapor discharge lamp 12 and generates a second signal at a positive voltage level which is amplified by preamplifier 50 and supplied to inverting input 54b of comparator U2. When the voltage level of the second signal present at inverting input 54b of comparator U2 exceeds the voltage of voltage reference $V_{REF1}$ (e.g. one volt) present at non-inverting input 54a of comparator U2, comparator U2 responds by generating a zero error signal to turn OFF switching transistor Q1 to thereby effectively raise the resistance between excitation output 24 to the resistance of parallel resistors R14, R15, R30 by establishing a substantially infinite resistance in parallel with parallel resistors R14, R15, R30, thereby establishing an effective total resistance between excitation output 24 and ground 42 which is substantially equal to the parallel resistance of resistors R14, R15, R30 which is higher than the resistance of the parallel combination of resistors R3, R4, R14, R15, and R30. Accordingly, during the run mode, when oscillator FET Q2 is gated at its gate input. 32a, oscillator FET Q2 responds by conducting a current flow between drain 32b and excitation output 24 which is at a reduced current level from the current level associated with the ignition mode.

The current flow through oscillator FET Q2 is dependent upon the effective resistance between excitation output 24 of oscillator FET Q2 and ground 42. Such is not the case, however, with regard to the DC voltage present at excitation output 24. The current levels established through oscillator FET Q2 are dependent upon the total effective resistance between excitation output 24 and ground 42 resulting from the parallel combination of resistors R14, R15, R30 with the resistors R3, R4 in series with the controlled current path between terminals 56b and 56c of switching transistor Q1. The DC voltage at the excitation output 24 of oscillator FET Q2, however, is conveniently controlled to remain substantially constant regardless of whether lamp oscillator 10A is operating in the ignition mode or the run mode.

As shown in FIG. 2, control circuit 20A includes an op-amp U1 configured as an integrating comparator which generates an error signal based upon a voltage difference between the DC voltage drop across resistors R14, R15, R30 (i.e. the DC voltage at excitation output 24 of oscillator FET Q2 when measured to ground 42) and a reference voltage $VREF_2$ (e.g., 0.38 volts), which is used to control oscillator FET Q2 to maintain a substantially constant DC voltage at excitation output 24 during both the ignition mode and the run mode.

Voltage reference $VREF_2$ is generated by a circuit including three resistors, R5, R6, and R7, connected in series between output 55 of DC voltage source 57 and ground 42. A 2.5 volt zener-like diode VR1, such as a band-gap zener diode, is connected in parallel with the series resistors R6, R7 so as to establish a controlled voltage drop of 2.5 volts across resistors R6, R7. The values of resistors R6, R7 are selected so as to generate the desired voltage drop across resistor R7 (e.g. 0.38 volts), which in turn establishes the voltage of voltage reference $VREF_2$.

The current flowing through oscillator FET Q2 is controlled by op-amp U1 so that the DC voltage from the excitation output 24 to ground 42 is substantially equal to the voltage of voltage reference $V_{REF2}$. For example, if the voltage of $V_{REF2}$ is equal to 0.38 volts, then the DC voltage from excitation output 24 to ground 42 will be controlled to be substantially equal to 0.38 volts, regardless of whether the current through oscillator FET Q2 is at the higher level as it is during the ignition mode by turning switching transistor Q1 ON, or whether the current through oscillator FET Q2 is reduced to the lower level as it is during the run mode by turning switching transistor Q1 OFF, provided the DC resistance of inductor L2 is small.

Op-amp U1 includes a non-inverting input 62a, an inverting input 62b and an output 62c. Non-inverting input 62a is coupled to a reference voltage $V_{REF2}$, which is preferably about 0.38 volts. The actual voltage for $V_{REF2}$, however, is a voltage which is the best compromise between being large enough to dominate the errors of op-amp U1 (e.g. Vos, Ibias, Ioffset and noise), while being kept as low as possible to maximize the voltage available for the operation of oscillator FET Q2 and to minimize power losses in resistors R3, R4, R14, R15, and R30. Inverting input 62b of op-amp U1 is coupled to excitation output 24 of oscillator FET Q2 via resistor R8, conductor 64, conductor 28, and inductor L2. Output 62c of op-amp U1 is coupled to gate 32a of oscillator FET Q2 via conductor 30 and low pass filter 34. The current flowing through oscillator FET Q2 generates a voltage drop across parallel resistors R14, R15, R30, which in turn is applied to the inverting input 62b of op-amp U1. op-amp U1 then compares the voltage drop across resistors R14, R15, R30 with the voltage of voltage reference $V_{REF2}$ which is present at the non-inverting input 62a of op-amp U1. Any difference between the voltage levels at the non-inverting and inverting inputs 62a and 62b, respectively, of op-amp U1 results in a significant change of voltage level at the output of op-amp U1, as delayed by the integrating effect of a capacitor C7.

If the voltage at inverting input 62b exceeds the voltage at non-inverting input 62a, yielding a positive error, then op-amp U1 responds by reducing the magnitude of the voltage at output 62c which is applied to the gate 32a of oscillator FET Q2. Oscillator FET Q2 responds by reducing the current flow therethrough, thereby reducing the voltage drop across resistors R14, R15, which in turn reduces the voltage at the inverting input 62b of op-amp U1, thereby reducing the positive error.

If the voltage at inverting input 62b is less than the voltage at non-inverting input 62a, yielding a negative error, then op-amp U1 responds by increasing the magnitude of the voltage at output 62c which is applied to the gate 32a of oscillator FET Q2. Oscillator FET Q2 responds by increasing the current flow therethrough, thereby increasing the voltage drop across parallel resistors R14, R15, which in turn increases the voltage at the inverting input 62b of op-amp U1, thereby reducing the negative error.

Therefore, the DC voltage from excitation output 24 to ground 42 will be controlled to be substantially equal to the voltage of $VREF_2$. Such control takes place regardless of whether the current through oscillator FET is at the higher level as it is during the ignition mode by turning switching transistor Q1 ON, or whether the current through oscillator FET Q2 is reduced to the lower level as it is during the run mode by turning switching transistor Q1 OFF. Thus, lamp oscillator 10A advantageously maintains a substantially constant voltage swing capability for the r.f. excitation voltage at excitation output 24 of oscillator FET Q3 during both the ignition mode and the run mode.

In the preferred embodiments shown in FIGS. 3 and 4, additional control circuitry is added to the embodiments of FIGS. 1 and 2 to enhance the operation of the circuit components used to maintain the substantially constant voltage swing capability for the lamp excitation voltage.

FIG. 3 shows a block diagram of a preferred embodiment of the invention which differs from the embodiment of FIG. 1 in that a summing node 70 is provided between low pass filter 34 and control input 32a of oscillator transistor Q2, and in that a shift circuit 72 is inserted between excitation output 24 of oscillator transistor Q2 and summing node 70. Accordingly, to avoid undue repetition, features of the embodiments of FIGS. 1 and 3, and FIGS. 2 and 4, which operate in a like manner will not be repeated below.

Shift circuit 72 samples the r.f. signal present at excitation output 24 of oscillator transistor Q2 via conductor 73 and rectifies the r.f. signal component of the oscillator output to generate a DC shift signal proportional to the r.f. output. The DC shift signal, however, has a polarity opposite to the polarity of the voltage signal at output 62c of control op-amp U1. The DC shift signal from shift circuit 72 is "summed" with a filtered output signal from control op-amp U1 to generate a composite signal which is coupled to control input 32a of oscillator transistor Q2. Because the DC shift signal has a polarity opposite to the output signal of op-amp U1, the magnitude of the composite signal is shifted in the negative direction. A reduction in the voltage of the signal applied to control input 32a of oscillator transistor Q2 has a control effect on transistor Q2 to reduce the current flow therethrough, thereby lowering the voltage across resistance 40 (i.e. lowering the voltage between excitation output 24 and ground 42). Control op-amp U1, however, operates to maintain a voltage drop across resistance R40 substantially equal to the voltage of voltage reference $VREF_2$. THUS, op-amp U1 responds to the imposition of the opposite polarity DC shift signal by generating a more positive output voltage sufficient to nullify the negative voltage of the DC shift signal at control input 32a of oscillator transistor Q2. Therefore, as shown in FIG. 4, shift circuit 72 causes control op-amp U1 to generate a positive output signal increased in magnitude by the amount of $[(R10+R11)/R12]$ times the negative DC shift signal. This shifts the required control range of control op-amp U1 for example, from a range of about −0.5 volts to about 10 volts to a range of about 0.0 volts to about 10.5 volts. Such a shifted range is desirable to accommodate the operating range of op-amp U1 and the FET when such a transistor is used for oscillator transistor Q2, and while using a single positive supply voltage for U1.

Although shift circuit 72 has been described wherein the supply voltage to op-amp U1 is positive, it is contemplated that the circuit may be easily modified to operate using a negative supply voltage for op-amp U1, in which the control range would be shifted, for example, from a range of about 0.5 volts to about −10 volts, to a range of about 0.0 volts to 10.5 volts.

In addition to accommodating the operating range of op-amp U1 and the FET Q2, shift circuit 72 of control circuit 2B shown in FIGS. 3 and 4 provides additional suppression of blocking oscillations over the suppression capability of the control circuitry 20A shown in FIGS. 1 and 2. For example, the control circuitry 20A shown in FIGS. 1 and 2 will oppose blocking oscillations (i.e. low frequency amplitude modulations) of the transistor current through Q2 within the bandwidth of control circuit 20A. The bandwidth is defined as the range of frequencies from 0 hertz to some upper frequency at which the loop gain is equal to 1, such as for example, 13 kHz to 26 kHz. As shown in FIGS. 1 and 2, contributors to the loop gain are op-amp U1, filter 34, transistor Q2, and inductor L2. At frequencies above the bandwidth of control circuit 20A, however, there is no mechanism to oppose current modulation of the excitation output signal of transistor Q2. In the embodiments shown in FIGS. 3 and 4, however, the addition of shift circuit 72 provides suppression of blocking oscillations at frequencies above the bandwidth of control circuit 20B. This is because that since shift circuit 72 is configured as a source of negative feedback to the base or gate of transistor Q2, an increase in the amplitude of the r.f. excitation signal will reduce the bias voltage on the gate or base of transistor Q2, thus opposing the increase in transistor current modulation. As an added benefit, transistor Q2 can be operated to oscillate at lower currents without generating blocking oscillations, than would be possible in the absence of shift circuit 72, thereby reducing the power consumption of the oscillator.

In the embodiments shown in FIGS. 3 and 4, which include shift circuit 72, the resistor value for resistor R12 is empherically optimized to provide the best suppression of blocking oscillations, while still yielding the proper shift in the control range of op-amp U1, as described above. In addition, it is contemplated that shift circuit 72 may be adapted to be used with either bi-polar oscillators or FET oscillators through empherically determining the value of resistor R12.

As shown in FIG. 3, summing node 70 includes a first input terminal 70a coupled to output 62c of op-amp U1 via low pass filter 34 and conductor 30. Summing node 70 further includes a second input terminal 70b coupled to an output 72a of shift circuit 72 via a conductor 74. An output terminal 70c of summing node 70 is coupled to the controlled input 32a of oscillator transistor Q2 via a conductor 76.

As shown in FIG. 4, oscillator transistor Q2 is preferably a FET, as explained above. Shift circuit 2 includes an input 72b coupled to excitation output 4 (corresponding to source 32c) of oscillator FET Q2 via conductor 73. The output 72a of shift circuit 72 is coupled to output 62c of op-amp U1 via summing node 70, low pass filter 34 and conductor 30.

Shift circuit 72 includes a high frequency switching diode CR1, a capacitor C11 and a resistor R12. High frequency switching diode CR1 includes a cathode 78c coupled to excitation output 24 (source 32c) of oscillator FET Q2. An anode 78a of high frequency switching diode CR1 is connected to a first terminal 80a of capacitor C11. A second terminal 80b of capacitor C11 is coupled to ground 42. Summing resistor R12 includes a first terminal 82a coupled to anode 78a of high frequency switching diode CR1 and a second terminal 82b coupled to output 62c of op-amp U1 via low pass filter 34 and conductor 30.

High frequency switching diode CR1 samples the r.f. signal present at excitation output 24 of oscillator FET Q2 and rectifies the r.f. signal to generate a DC shift signal corresponding to the r.f. signal. The DC shift signal has a polarity opposite to the polarity of the voltage signal at output 62c of control op-amp U1. The DC shift signal from high frequency switching diode CR1 is filtered by capacitor C11 and summed via resistor R12 at summing node 70 with a filtered output signal from op-amp U1 to generate a composite signal which is coupled to gate 32a of oscillator FET Q2, with the effect that, absent the control action of op-amp U1, the magnitude of the composite signal would be less than the magnitude of the output signal from op-amp U1 and the reduction in the voltage of the signal applied to gate 32a of oscillator FET Q2 would tend to reduce the current flow through FET Q2, thereby lowering the voltage drop across resistors R14, R15, R30 (i.e. lowering the voltage between excitation output 24 and ground 42). Op-amp U1, however, operates to maintain a voltage drop across resistors R14, R15, R30 which is substantially equal to the voltage of voltage reference $V_{REF2}$. Thus, op-amp U1 responds by generating a more positive output voltage sufficient to nullify the voltage of the DC shift signal at summing node 70. Therefore, shift circuit 72 causes op-amp U1 to generate a positive output signal increased in magnitude by [(R10+R11)/R12] times the amount of the negative DC shift signal, thereby shifting the effective control range of op-amp U1 in the positive direction by, for example, 0.5 volts to meet the output range capability of op-amp U1.

Figure 5:
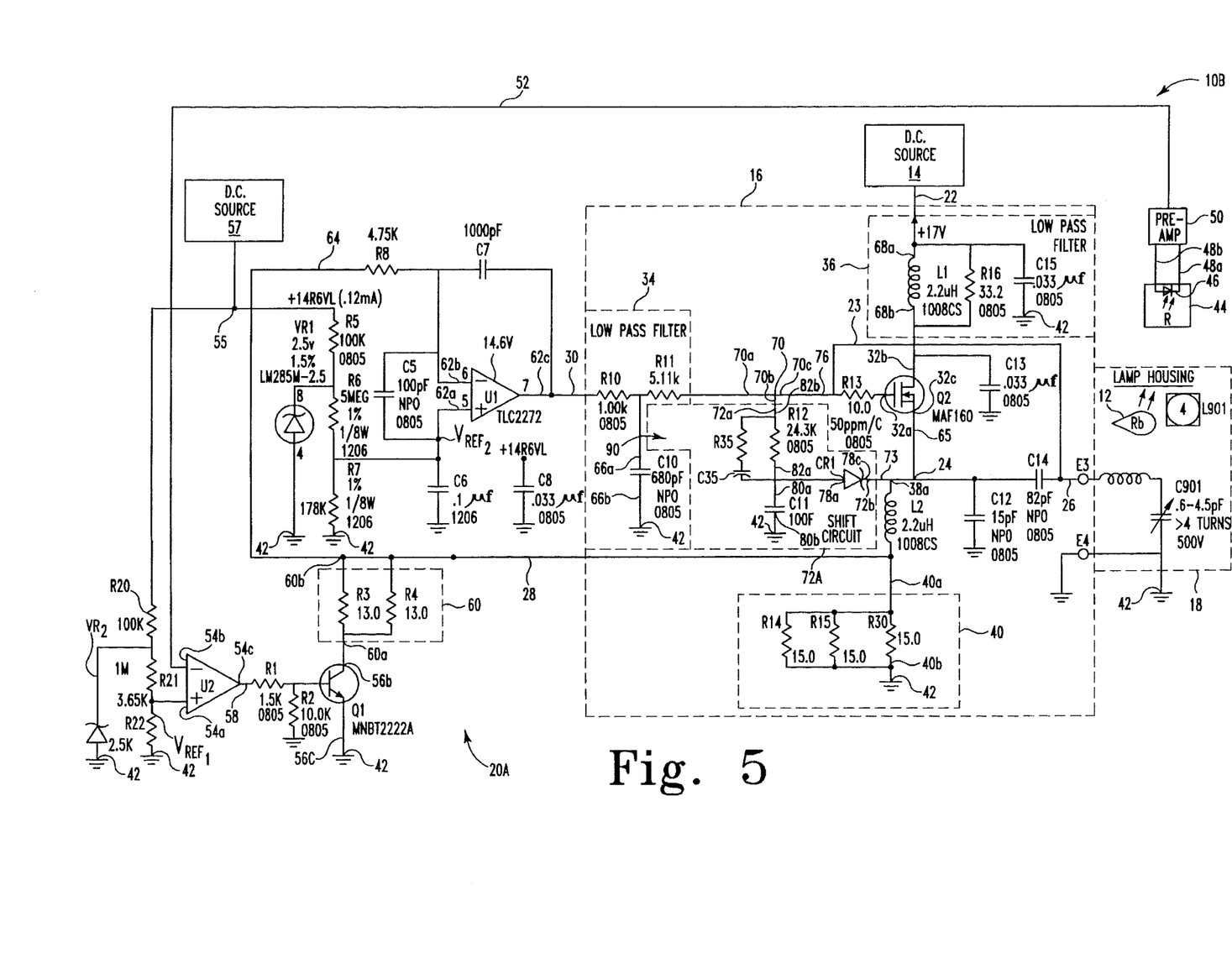
FIG. 5 shows a schematic diagram of a second preferred circuit configuration corresponding to the lamp oscillator shown in FIG. 3.

FIG. 5 shows another embodiment for shift circuit 72 of FIG. 3, and is labeled as shift circuit 72A. Shift circuit 72A differs in structure from shift circuit 72 of FIG. 4 by the addition of an R-C circuit 90 coupled in parallel with resistor R12 to allow the AC feedback gain of shift circuit 72A to be adjusted independently from the DC feedback of shift circuit 72A. Preferrably, R-C circuit 90 includes a resistor R35 connected in series with a capacitor C35. R-C circuit 90 does not affect the DC feedback gain of shift circuit 72A, but does affect the AC feedback gain of shift circuit 72A. Thus, the DC feedback gain may be adjusted, for example, by varying the value of R12 to achieve the best operating range of op-amp U1. Thereafter, the AC feedback gain, resulting from the parallel combination of resistor R12 and R-C circuit 90, may be adjusted by varying, for example, the value(s) of resistor R35 and/or capacitor C35 to achieve the best blocking oscillations suppression, without affecting the DC feedback gain set by the value of R12.

The value of capacitor C35 is chosen to be large enough to allow R-C circuit 90 to be substantially resistive in the blocking oscillations frequency range, such as between 100 kHz and 400 kHz, and yet still provide some phase lead in the blocking oscillations frequency range. For example, a value for capacitor C35 of 39 pF and a value for resistor R35 of 5.6 k $\Omega$ provides about 36 degrees of phase lead at 400 kHz.

Although the invention has been described with reference to preferred embodiments, those skilled in the art will recognize that changes may be made in form and in detail without departing from the spirit and scope of the following claims.

What is claimed is:

1. An apparatus for providing excitation of a vapor discharge lamp, comprising:

a substantially constant voltage DC power source;

an oscillator circuit coupled to said power source, and including a first transistor configured with regenerative feedback, said first transistor having an excitation output coupled to said vapor discharge lamp; and control means for controlling said oscillator circuit during an ignition stage of said vapor discharge lamp to establish and maintain a substantially constant DC voltage at said output of said first transistor and to establish a current flow through said first transistor at a first current level sufficient to ignite said vapor discharge lamp, and for controlling said oscillator after ignition of said vapor discharge lamp to maintain said substantially constant DC voltage at said output of said first transistor while reducing said current flow through said first transistor from said first current level to a second current level.

2. The apparatus of claim 1, wherein after said ignition of said vapor discharge lamp, said control means maintains a constant input power to said oscillator circuit.

3. The apparatus of claim 1, wherein said first transistor is a field effect transistor.

4. The apparatus of claim 1, wherein said first transistor is a bipolar transistor.

5. The apparatus of claim 1, wherein said control means comprises:

a photodetector circuit having a photodetector positioned to receive light from said vapor discharge lamp, and having an output for supplying a signal corresponding to an amount of detected light;

a light comparator having a first input coupled to a reference voltage, a second input coupled to said output of said photodetector, and an output;

a switching transistor having a first terminal and a second terminal, said first terminal being coupled to said output of said light comparator; and a resistor having a first terminal coupled to said second terminal of said switching transistor and having a second terminal coupled to said output of said first transistor.

6. The apparatus of claim 5, wherein prior to ignition of said vapor discharge lamp said photodetector circuit detects an absence of light from said vapor discharge lamp and generates a first signal which is supplied to said second input of said light comparator, said light comparator responding by generating an error signal for turning ON said switching transistor to thereby establish a current flow at said first current level through said first transistor, and wherein after said ignition of said vapor discharge lamp, said photodetector circuit detects the presence of light and generates a second signal which is supplied to said light comparator, said light comparator responding by turning OFF said switching transistor to reduce said current flow through said first transistor from said first current level to said second current level.

7. The apparatus of claim 1, wherein said control means comprises:

a control op-amp having a first input coupled to a reference voltage, a second input coupled to said output of said first transistor, and an output coupled to an input of said first transistor; and a shift circuit having an input coupled to said output of said first transistor and having an output coupled to said output of said control op-amp, said shift circuit shifting the effective operating range of said control op-amp.

8. The apparatus of claim 7, wherein an output of said shift circuit is summed with an output of said control op-amp.

9. The apparatus of claim 7, wherein said shift circuit samples the r.f. signal present at said output of said first transistor and rectifies said r.f. signal to generate a DC shift signal corresponding to said r.f. signal having a polarity opposite to the polarity of the output of said control op-amp to force said control op-amp to generate an output voltage to nullify a voltage of said DC shift signal.

10. The apparatus of claim 7, wherein said shift circuit comprises:
 a high frequency switching diode having a cathode coupled to said output of said first transistor;
 a capacitor having a first terminal connected to an anode of said switching diode, and having a second terminal coupled to a circuit ground; and
 a resistor having a first terminal coupled to said anode of said switching diode and having a second terminal coupled to said output of said control op-amp.

11. The apparatus of claim 1, wherein said control means comprises:
 a control op-amp having a first input coupled to a reference voltage, a second input coupled to said output of said first transistor, and an output coupled to an input of said first transistor; and
 a shift circuit having an input coupled to said output of said first transistor and having output coupled to said output of said control op-amp, said shift circuit shifting the effective operating range of said control op-amp, and suppressing blocking oscillations at a frequency above a bandwidth of said control means.

12. The apparatus of claim 1, wherein said control means comprises;
 a control op-amp having a first input coupled to a reference voltage, a second input coupled to said output of said first transistor, and an output coupled to an input of said first transistor; and
 a shift circuit having an input coupled to said output of said first transistor and having an output coupled to said output of said control op-amp, said shift circuit shifting the effective operating range of said control op-amp, and suppressing blocking oscillations, thereby allowing said first transistor to operate at lower operating currents without the presence of blocking oscillations, than would be possible in the absence of said shift circuit.

13. An apparatus for providing excitation of a vapor discharge lamp, comprising:
 a regulated DC power source;
 an oscillator circuit coupled to said power source, and including a first transistor configured with regenerative feedback, said first transistor having an excitation output coupled to said vapor discharge lamp;
 control means for controlling said oscillator circuit, said control means including a control op-amp having a first input coupled to a reference voltage, a second input coupled to said output of said first transistor, and an output coupled to an input of said first transistor; and
 a shift circuit having an input coupled to said output of said first transistor and having an output coupled to said output of said control op-amp, wherein said shift circuit samples the r.f. signal generated at said output of said first transistor and rectifies said r.f. signal to generate a DC shift signal corresponding to said r.f. signal having a polarity opposite to the polarity of the output of said control op-amp, said DC shift signal thereby shifting the operating range of said control op-amp in a direction opposite to the polarity of said DC shift signal.

14. The apparatus of claim 13, wherein said first transistor is a field effect transistor.

15. The apparatus of claim 13, wherein said first transistor is a bipolar transistor.

16. The apparatus of claim 13, wherein the output of said control op-amp is controlled to nullify the effect of said DC shift signal at the input of said first transistor.

17. The apparatus of claim 13, wherein said shift circuit comprises:
 a high frequency switching diode having a cathode coupled to said output of said first transistor;
 a capacitor having a first terminal connected to an anode of said switching diode, and having a second terminal coupled to a circuit ground; and
 a first resistor having a first terminal coupled to said anode of said switching diode and having a second terminal coupled to said output of said control op-amp.

18. The apparatus of claim 17, further comprises an R-C circuit in parallel with said first resistor.

19. The apparatus of claim 17, wherein said shift circuit comprises:
 means for setting a DC feedback gain of said shift circuit; and
 means for setting an AC feedback gain of said shift circuit, wherein an adjustment of said AC feedback gain does not affect an amount of said DC feedback gain.

20. The apparatus of claim 13, wherein said control means further includes a start-up circuit for controlling said oscillator circuit during an ignition stage of said vapor discharge lamp to establish and maintain a substantially constant DC voltage at said output of said first transistor and to establish a current flow through said first transistor at a first current level sufficient to ignite said vapor discharge lamp, and for controlling said oscillator after ignition of said vapor discharge lamp to maintain said substantially constant DC voltage at said output of said first transistor while reducing said current flow through said first transistor from said first current level to a second current level.

21. The apparatus of claim 20, wherein, after said ignition of said vapor discharge lamp, said start-up circuit maintains a constant input power to said oscillator circuit.

22. The apparatus of claim 20, wherein said start-up circuit comprises:
 a photodetector circuit having a photodetector positioned to receive light from said vapor discharge lamp, and having an output for supplying a signal corresponding to an amount of detected light;
 a light comparator having a first input coupled to a reference voltage, a second input coupled to said output of said photodetector, and an output;
 a switching transistor having a first terminal and a second terminal, said first terminal being coupled to said output of said light comparator; and
 a resistor having a first terminal coupled to said second terminal of said switching transistor and having a second terminal coupled to said output of said first transistor.

23. The apparatus of claim 22, wherein prior to ignition of said vapor discharge lamp said photodetector circuit detects an absence of light from said vapor discharge lamp and generates a first signal which is supplied to said second input of said light comparator, said light comparator responding by generating an error signal for turning ON said switching transistor to thereby establish a current flow at said first current level through said first transistor, and wherein after said ignition of said vapor discharge lamp, said photodetector circuit detects the presence of light and generates a second signal which is supplied to said light comparator, said light comparator responding by turning OFF said switching transistor to reduce said current flow through said first transistor from said first current level to said second current level.

24. The apparatus of claim 13, wherein said shift circuit extends the operating range of said control op-amp to allow said first transistor to oscillate at lower operating currents without generating blocking oscillations, than would be possible in the absence of said shift circuit.

25. The apparatus of claim 13, wherein said shift circuit suppresses blocking oscillations at a frequency greater than the bandwidth of said control means.

26. An apparatus for providing excitation of a vapor discharge lamp, comprising:

a DC power source with a regulated substantially constant output voltage;

an oscillator circuit coupled to said power source output voltage, and including a first transistor configured with regenerative feedback, said first transistor having an excitation output coupled to said vapor discharge lamp;

first circuit means for controlling said oscillator circuit to establish and maintain a substantially constant DC voltage at said output of said first transistor, said first circuit means including a control op-amp having a first input coupled to a reference voltage, a second input coupled to said output of said first transistor, and an output coupled to an input of said first transistor, and wherein a shift circuit samples the r.f. signal generated at said output of said first transistor and rectifies said r.f. signal to generate a DC shift signal corresponding to said r.f. signal having a polarity opposite to the polarity of the output of said control op-amp to force said control op-amp to generate an output voltage to nullify a voltage of said DC shift signal, thereby shifting the operating range of said control op-amp; and second circuit means for controlling a current flow through said first transistor, wherein during an ignition stage of said vapor discharge lamp said second circuit means establishes a current flow through said first transistor at a first current level sufficient to ignite said vapor discharge lamp, and after ignition of said vapor discharge lamp, said second circuit means reduces said current flow through said first transistor from said first current level to a second current level.

27. The apparatus of claim 26 wherein, after said ignition of said vapor discharge lamp, said first circuit means and said second circuit means maintain a constant input power to said oscillator circuit.

28. The apparatus of claim 26, wherein said first transistor is a field effect transistor.

29. The apparatus of claim 26, wherein said first transistor is a bipolar transistor.

30. The apparatus of claim 26, wherein said second circuit means comprises:

a photodetector circuit having a photodetector positioned to receive light from said vapor discharge lamp, and having an output for supplying a signal corresponding to an amount of detected light;

a light comparator having a first input coupled to a reference voltage, a second input coupled to said output of said photodetector, and an output;

a switching transistor having a first terminal and a second terminal, said first terminal being coupled to said output of said light comparator; and a resistor having a first terminal coupled to said second terminal of said switching transistor and having a second terminal coupled to said output of said first transistor.

31. The apparatus of claim 30, wherein prior to ignition of said vapor discharge lamp said photodetector circuit detects an absence of light from said vapor discharge lamp and generates a first signal which is supplied to said second input of said light comparator, said light comparator responding by generating an error signal for turning ON said switching transistor to thereby establish a current flow at said first current level through said first transistor, and wherein after said ignition of said vapor discharge lamp, said photodetector circuit detects the presence of light and generates a second signal which is supplied to said light comparator, said light comparator responding by turning OFF said switching transistor to reduce said current flow through said first transistor from said first current level to said second current level.

32. The apparatus of claim 26, wherein an output of said shift circuit is summed with an output of said control op-amp.

33. The apparatus of claim 26, wherein said shift circuit comprises:

a high frequency shifting diode having a cathode coupled to said output of said first transistor;

a capacitor having a first terminal connected to an anode of said high frequency shifting diode, and having a second terminal coupled to a circuit ground; and a resistor having a first terminal coupled to said anode of said high frequency shifting diode and having a second terminal coupled to said output of said control op-amp.

34. An apparatus for exciting a vapor discharge lamp, comprising:

a DC source providing a substantially constant voltage;

an oscillator circuit connected to said substantially constant voltage, including a current sensing resistance and providing an output for exciting said vapor discharge lamp;

an oscillator control circuit connected with said current sensing resistance and adapted to control said oscillator circuit to maintain a substantially constant DC voltage across said current sensing resistance; and switching means responsive to light from said vapor discharge lamp for reducing the resistance of said current sensing resistance; and whereby said output for exciting said vapor discharge lamp provides an increased current for igniting the vapor discharge lamp and a reduced current when said vapor discharge lamp is ignited and a substantially constant voltage swing capability under both conditions.

35. The apparatus of claim 34 wherein said oscillator circuit has substantially constant efficiency.

36. The apparatus of claim 34 wherein said apparatus further comprises a shift circuit connected with said output of said oscillating circuit and generating a DC shift signal connected with said oscillator control circuit to favorably shift the voltage range of its operation.

* * * * *